(12) United States Patent
Searby et al.

(10) Patent No.: US 6,628,512 B2
(45) Date of Patent: Sep. 30, 2003

(54) COMPUTER ENCLOSURE HAVING LOCKABLE ACCESS PANELS

(75) Inventors: Tom J Searby, Ft. Collins, CO (US); Michael P Eland, Fort Collins, CO (US); Ronald P Dean, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 16 days.

(21) Appl. No.: 09/845,543

(22) Filed: Apr. 30, 2001

(65) Prior Publication Data

US 2002/0159229 A1 Oct. 31, 2002

(51) Int. Cl.$^7$ .................................................. G06F 1/16
(52) U.S. Cl. ........................................ 361/683; 361/686
(58) Field of Search ................................ 361/683, 685, 361/686, 724–727, 730, 732

(56) References Cited

U.S. PATENT DOCUMENTS

| 5,397,176 A | 3/1995 | Allen et al. ............... 312/223.2 |
| 5,825,626 A | 10/1998 | Hulick et al. ................ 361/724 |
| 5,997,115 A | 12/1999 | Radloff et al. ............... 312/222 |
| 6,053,586 A | 4/2000 | Cook et al. ............... 312/223.2 |
| 6,109,710 A | 8/2000 | Wu et al. ................. 312/223.2 |
| 6,157,532 A | 12/2000 | Cook et al. ................. 361/681 |
| 6,209,975 B1 | 4/2001 | Lai ........................ 312/223.2 |
| 6,297,948 B1 * | 10/2001 | Buican et al. .............. 361/683 |
| 6,362,955 B2 * | 3/2002 | Felcman et al. ............ 361/683 |

* cited by examiner

Primary Examiner—Darren Schuberg
Assistant Examiner—Yean-Hsi Chang
(74) Attorney, Agent, or Firm—Kevin M. Hart

(57) ABSTRACT

A computer enclosure has first and second removable access panels. The access panels may be locked shut by securing them both to a chassis at a single point with a locking device. When the locking device is removed, each access panel may be opened and removed independently of the other access panel. The first removable access panel has a first locking tab. The second removable access panel has a second locking tab. The first and second locking tabs do not overlap one another. When the first and second removable access panels are mounted to the chassis, the chassis restrains the first and second removable access panels from movement in first and second orthogonal directions. When the locking device is in place, the locking device restrains the first and second removable access panels from movement in a third orthogonal direction by securing the first and second locking tabs to the chassis.

10 Claims, 9 Drawing Sheets

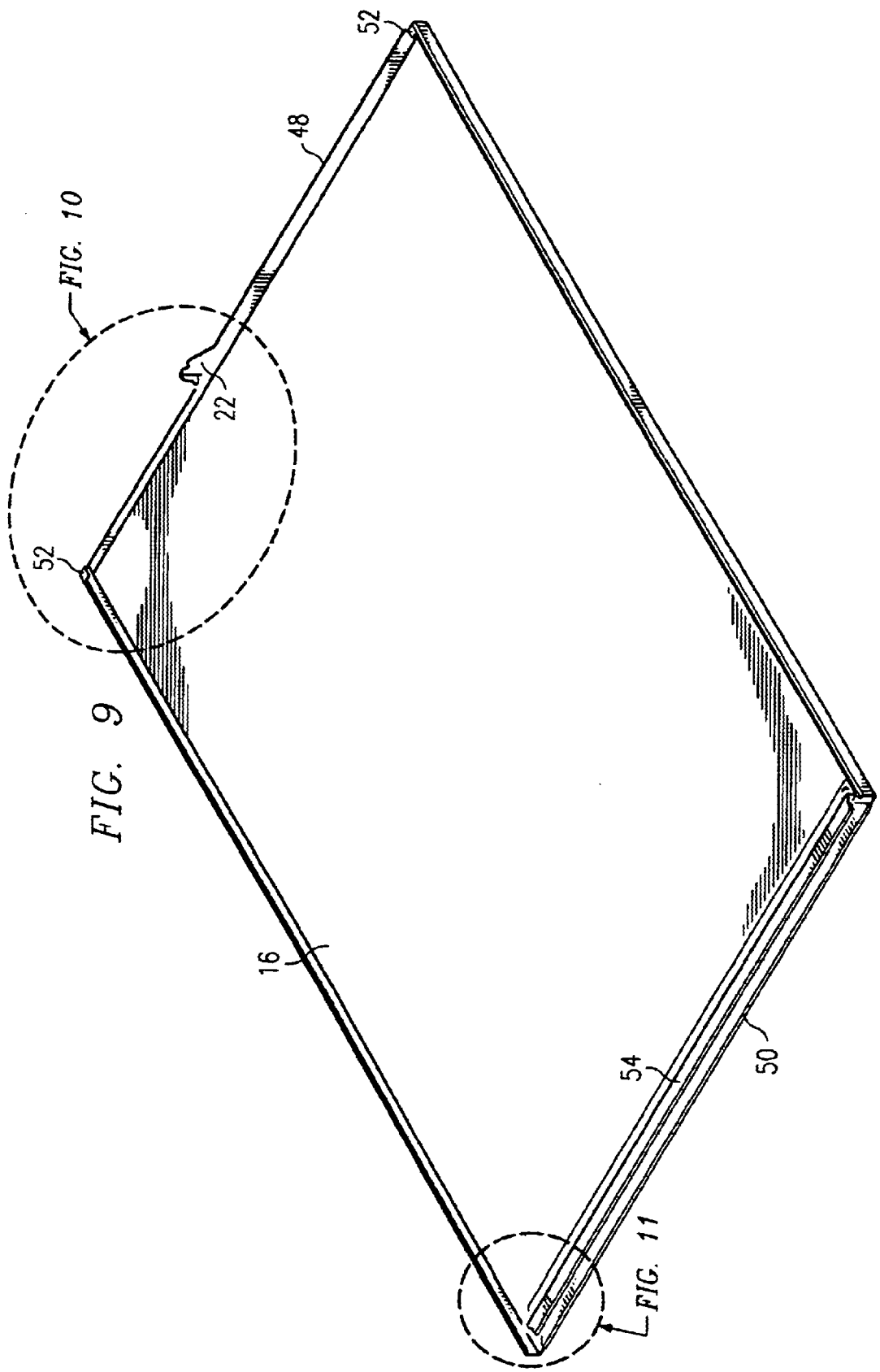

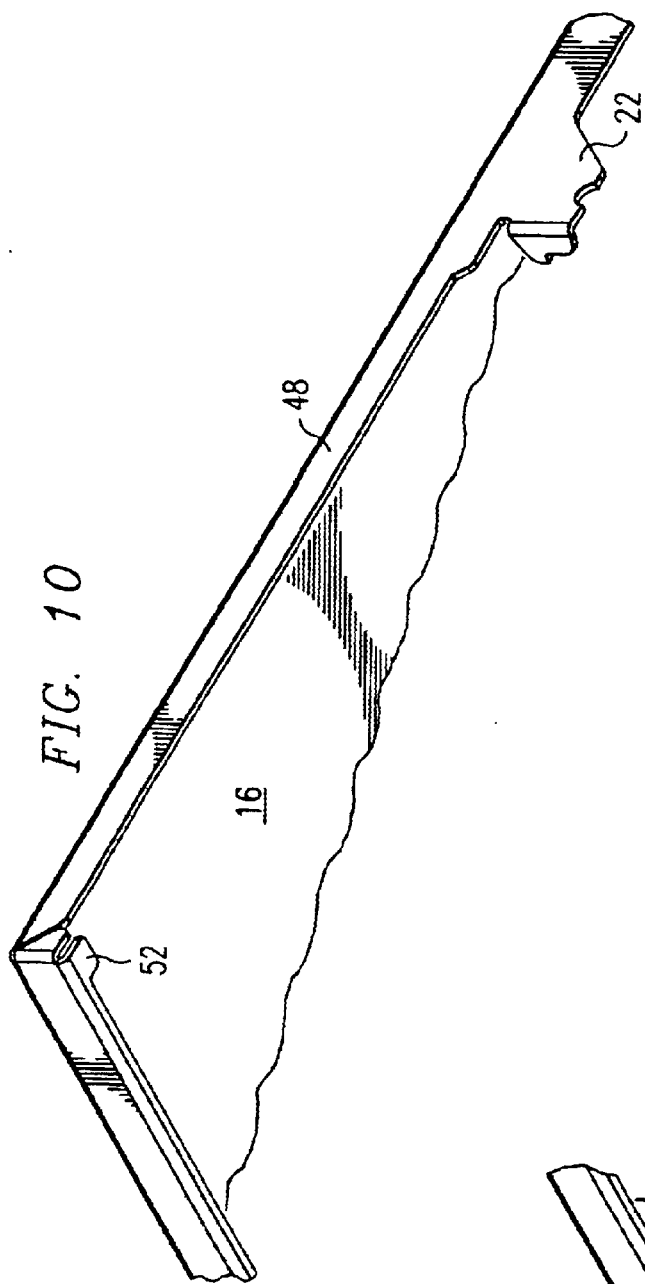
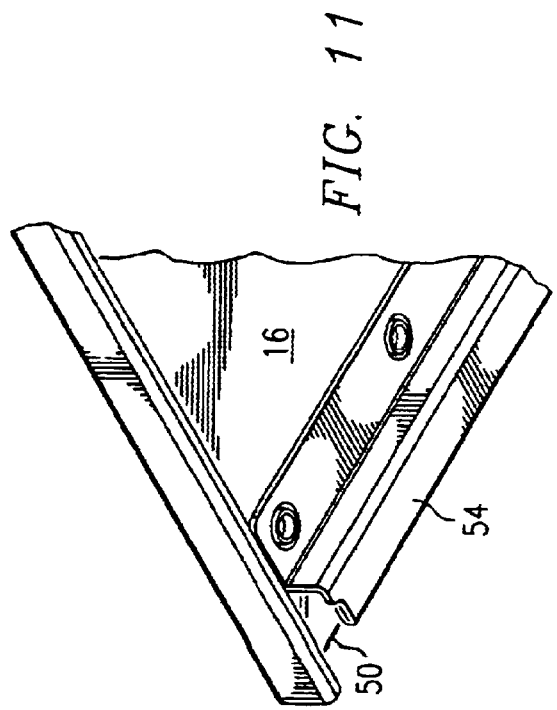

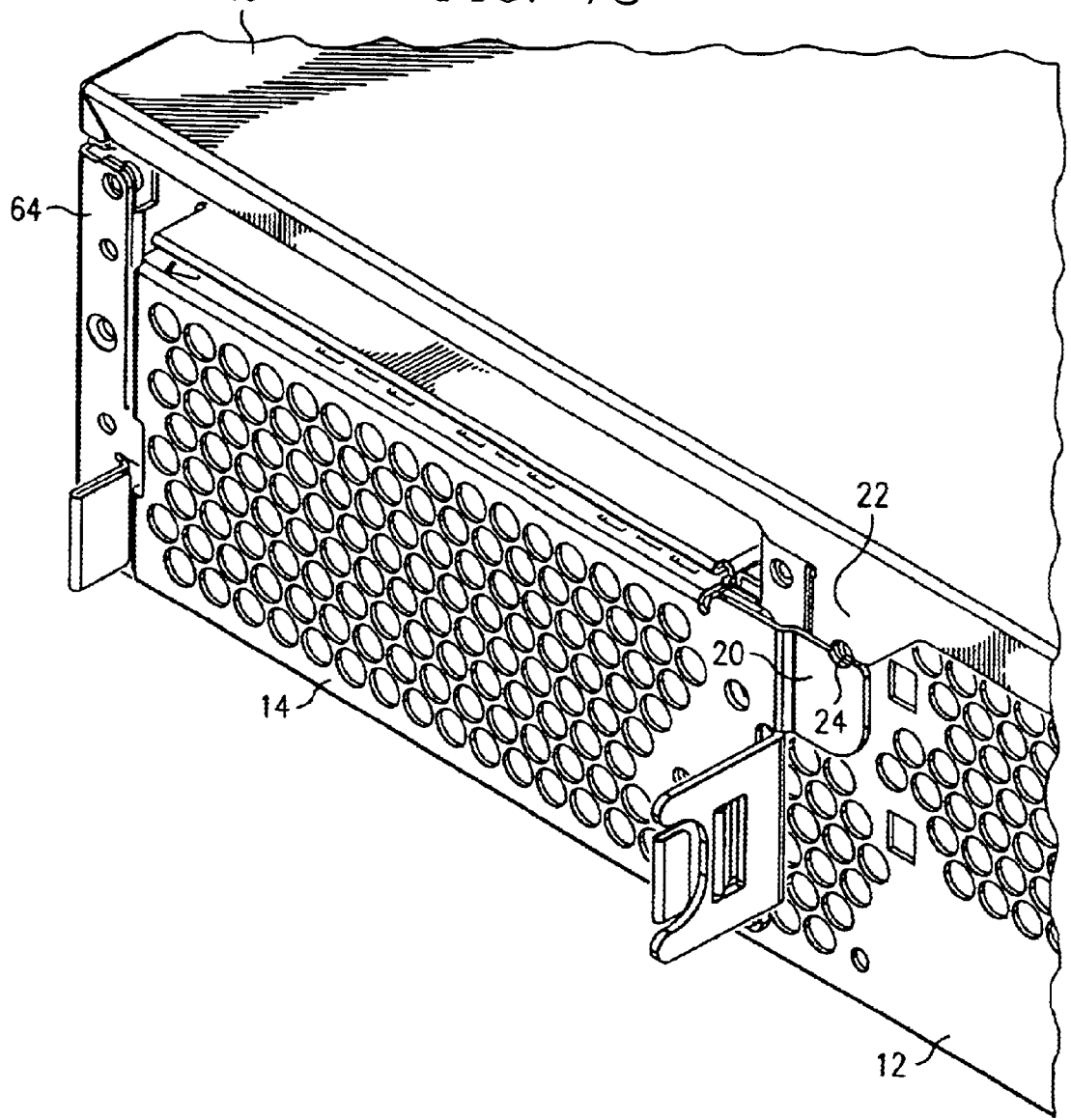

COMPUTER ENCLOSURE HAVING LOCKABLE ACCESS PANELS

FIELD OF THE INVENTION

This invention relates to computer enclosures. More specifically, the invention relates to techniques for locking access panels of a computer enclosure to prevent unauthorized access to components within the enclosure.

BACKGROUND

It is sometimes necessary or desirable to ensure that unauthorized persons are not able to access components contained inside the enclosure of a computer. By locking a computer enclosure shut, opportunities for theft, user injury and unauthorized reconfiguration of components may be reduced. Manufacturers have devised numerous techniques for accomplishing this purpose.

According to a first technique, a single side panel of an enclosure may be locked by fastening it to a chassis or to another panel of the enclosure. A sliding lock bar is used to prevent the panel from being disengaged. Examples of this technique may be found in several U.S. patents: In U.S. Pat. No. 6,109,710, issued to Thomas Wu et al. and assigned to Toshiba America Information Systems, Inc., a side panel of a desk top enclosure includes a sliding lock bar. The side panel is retained when protrusions on the sliding lock bar engage with protrusions on a chassis cover. In U.S. Pat. Nos. 6,157,532 and 6,053,586, issued to Stephen Cook et al. and assigned to Dell USA, L. P., a chassis of a tower enclosure includes a sliding lock bar. A side panel is retained when protrusions on the sliding lock bar prevent hooks on the side panel from being removed from the chassis. In U.S. Pat. No. 5,825,626, issued to Troy Hulick et al. and assigned to Apple Computer, Inc., a side panel of a tower enclosure includes hooks and a sliding lock bar. The side panel is retained when the hooks engage with holes in a chassis. When the sliding bar is in its locked position, the hooks are prevented from being disengaged from the chassis.

According to a second technique, two or more panels of an enclosure may be locked by fastening them to a chassis at a single point. An example of this technique may be found in U.S. Pat. No. 5,397,176, issued to Joseph Allen et al. and assigned to Compaq Computer Corporation. In that patent, two side panels of a tower enclosure each include a tab having a hole therein for receiving the bar of a padlock. A chassis also includes a tab having a hole therein. The two panels are retained when the panel tabs are aligned with the chassis tab and a padlock is passed through all three tabs.

While both of the above-described techniques serve useful purposes, each lacks one or more convenience factors. For example, each requires that an entire side of the computer enclosure must be removed to gain access to the components therein. Prior art techniques also lack flexibility: Each seems to be directed either to a tower enclosure or to a desk top enclosure, not both. It would be more flexible to have a technique that could be used either with a tower enclosure or a desk top enclosure. It would also be desirable to provide lockable access through the front or back of the enclosure as well as through the sides, top or bottom of the enclosure in a single design.

SUMMARY OF THE INVENTION

A computer enclosure according to the invention has at least first and second access panels. The access panels may be locked shut by securing them both to a chassis at a single point with a locking device. When the locking device is removed, each access panel may be opened independently of the other access panel.

In one aspect, an enclosure according to the invention includes a chassis, a first removable access panel having a first locking tab, a second removable access panel having a second locking tab, and a locking device for securing the first and second locking tabs to the chassis. The first and second locking tabs do not overlap one another. When the first and second removable access panels are mounted to the chassis, the chassis restrains the first and second removable access panels from movement in first and second orthogonal directions. When the locking device is in place, the locking device restrains the first and second removable access panels from movement in a third orthogonal direction by securing the first and second locking tabs to the chassis.

In another aspect, the front of the chassis includes a flange and a lock hole. A side of the flange facing the interior of the enclosure helps to retain the first access panel by engaging protrusions on the first access panel, thus preventing the protrusions from being pulled forward through the flange. The lock hole receives threads of a locking thumb screw. Top surfaces of the chassis define notches at each front corner of the chassis and a lip across a portion of the back of the chassis. The notches and lip on the chassis engage corresponding protrusions on the second access panel such that the second panel must be pulled forward to clear the notches and lip before it may be removed from the chassis. Each of the first and second access panels includes a locking tab that locates itself near the lock hole when the panels are mounted to the chassis. The locking tabs do not overlap one another. A head of the locking thumb screw is large enough to retain both locking tabs against the front of the chassis. As long as the locking thumb screw is fastened to the chassis, the first and second panels are prevented from being pulled forward; thus, they cannot be removed from the chassis. When the locking thumb screw is removed, however, the panels may be opened independently of one another because their locking tabs do not overlap one another.

A computer enclosure according to the invention provides convenience because it is not necessary to remove an entire side of the enclosure to access components therein. Rather, one of the access panels may constitute and entire side of the enclosure, while the other panel may constitute only a portion of one of the sides of the enclosure. For example, the first panel may be the top of the enclosure, and the second panel may be a door for accessing disk drives within the enclosure. The lockable disk drive door may be located on the front or back of the enclosure for added convenience. A single locking device may be used to secure both access panels. The invention may be applied in tower enclosures as well as in desk top enclosures.

BRIEF DESCRIPTION OF THE DRAWINGS

FIG. 1A is a perspective view of the computer enclosure of FIG. 1 arranged in a tower-type configuration.

FIG. 9 is an oblique view of the bottom of the second access panel of FIG. 1.

FIGS. 10 and 11 are close-up views of the areas indicated in FIG. 9.

FIG. 13 is top/front oblique view of the computer enclosure of FIG. 1 in which the locking device has been removed and the first and second access panels are closed.

DETAILED DESCRIPTION OF THE PREFERRED EMBODIMENTS

FIG. 1A illustrates an exemplary alternative embodiment in which the enclosure 10 is shown in a tower-type configuration.

Figure 1:
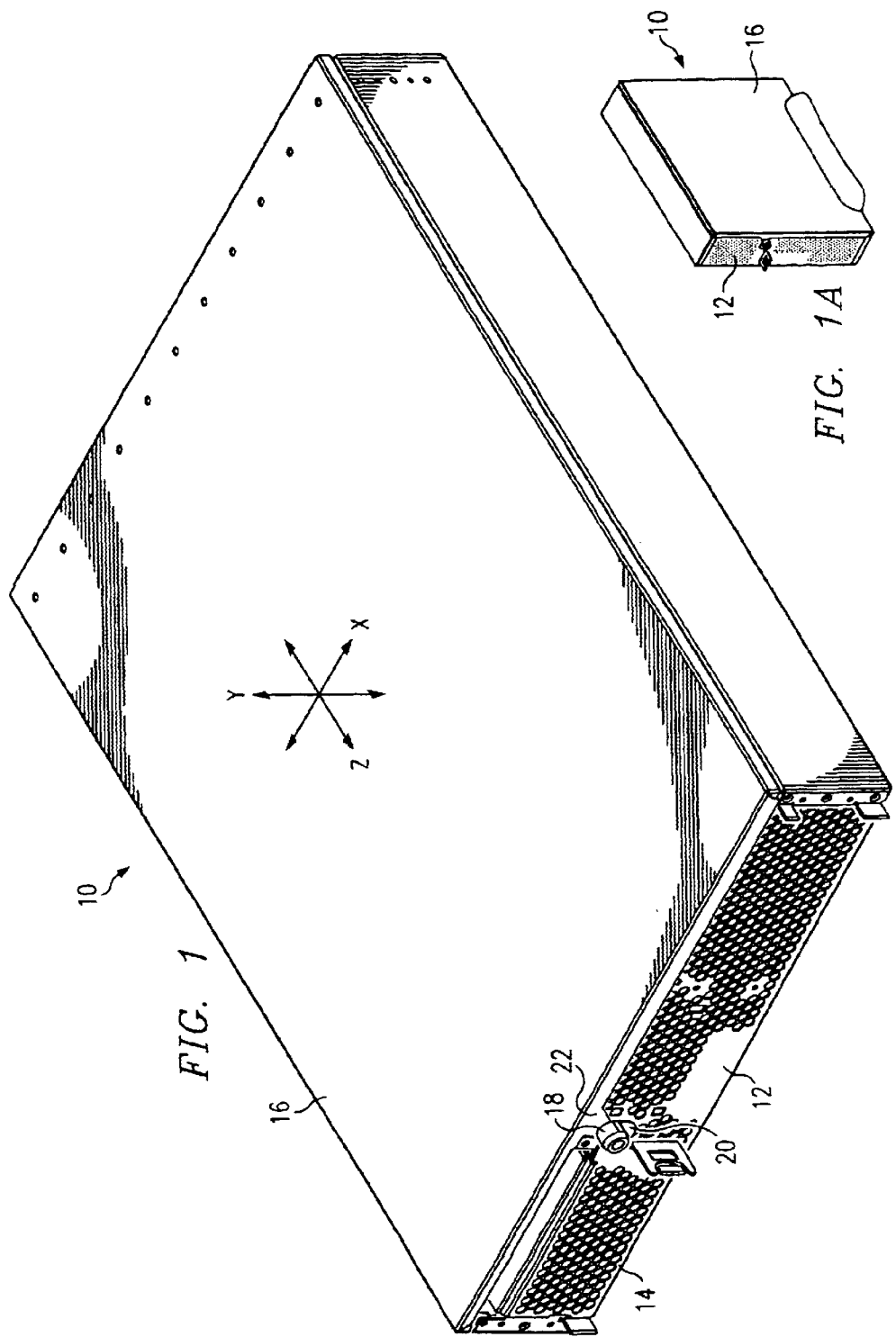
FIG. 1 is a top/front oblique view of a computer enclosure having lockable access panels according to a preferred embodiment of the invention.

FIG. 1 illustrates one example of a computer enclosure 10 having locking access panels according to a preferred embodiment of the invention. Computer enclosure 10 includes a chassis 12, a first removable access panel 14 having a first locking tab 20, a second removable access panel 16 having a second locking tab 22, and a locking device 18 for securing tabs 20, 22 to chassis 12 so that tabs 20, 22 do not overlap one another. When access panels 14, 16 are mounted to chassis 12 as shown, chassis 12 restrains the panels from moving in the x and y directions indicated in the drawing. (In the embodiment shown, chassis 12 also restrains panels 14, 16 from moving in the negative z direction indicated in the drawing.) When locking device 18 is in place securing tabs 20, 22 to chassis 12, locking device 18 restrains panels 14, 16 from moving in the positive z direction indicated in the drawing.

Figure 2:
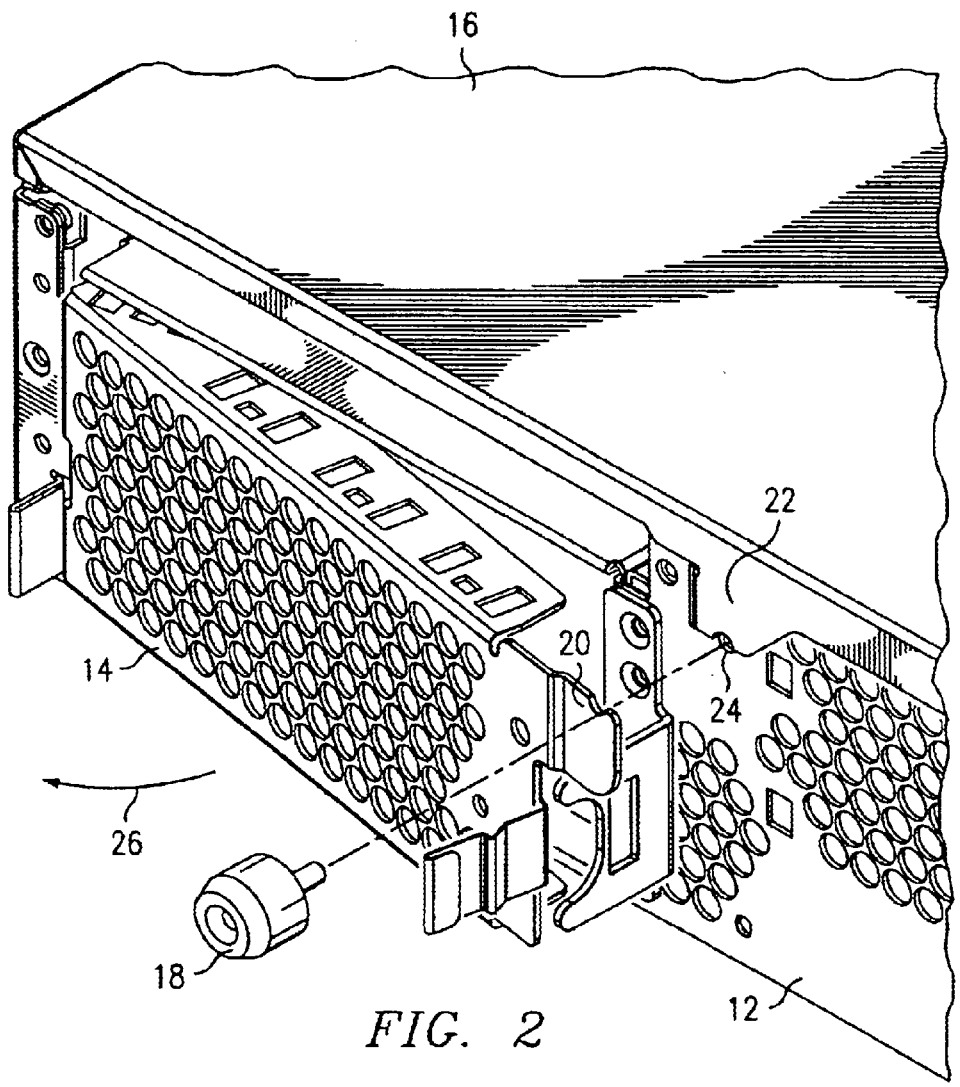
FIG. 2 is a top/front oblique view of the computer enclosure of FIG. 1 in which the locking device has been removed and a first access panel is being opened.

FIG. 2 illustrates how access panel 14 may be opened. Locking device 18 is removed from chassis 12 by unscrewing it from lock hole 24 using a key. After this is done, the end of panel 14 on which tab 20 is located is free to move in the positive z direction. Thus, panel 14 may swing away from chassis 12 toward the outside as indicated by arrow 26.

Figure 3:
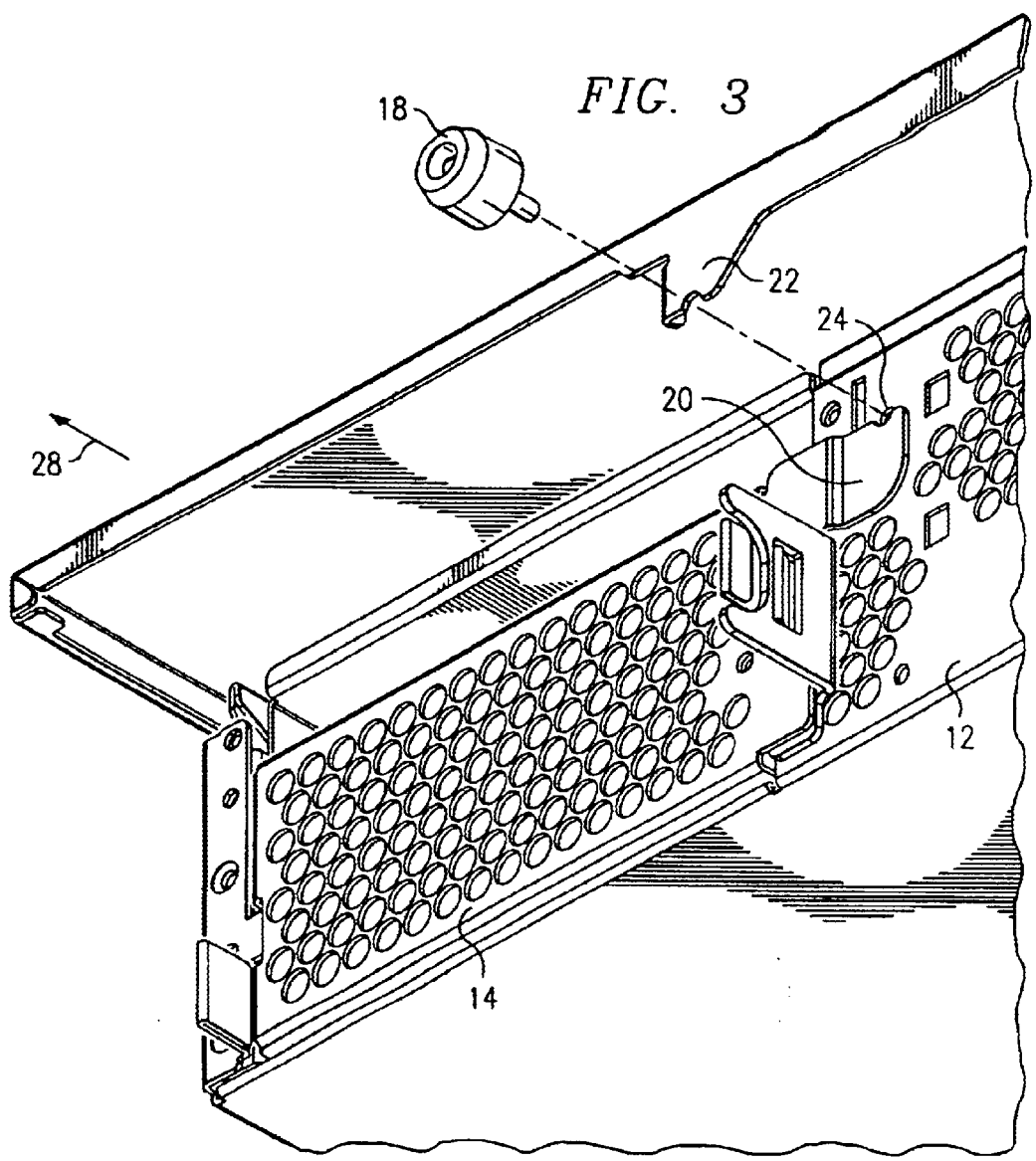
FIG. 3 is a bottom/front oblique view of the computer enclosure of FIG. 1 in which the locking device has been removed and a second access panel is being opened.

FIG. 3 illustrates how access panel 16 may be opened. After locking device 18 has been removed from chassis 12, panel 16 is free to move in the positive z direction indicated by arrow 28. After panel 16 has been moved a small distance in direction 28, it clears retaining surfaces on chassis 12 (to be described in more detail below) so that it may also be moved in the positive y direction.

Figure 4:
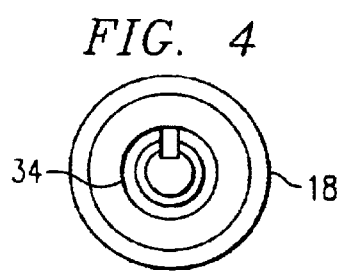
FIGS. 4 and 5 are front and top orthogonal views, respectively, of the locking device of FIG. 1.
Figure 5:
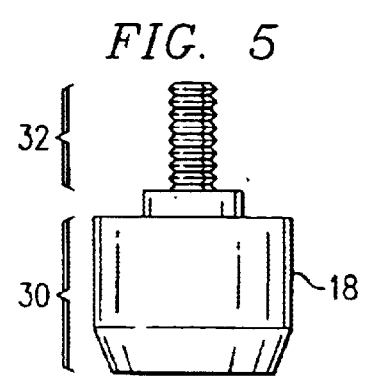

FIGS. 4 and 5 illustrate locking device 18 in more detail. Locking device 18 may be a locking thumb screw having a head 30 and a threaded stem 32. For example, one type of locking thumb screw suitable for use with enclosure 10 would be part number M68 from Dean Jang Enterprises Co., Ltd. (Taiwan). Such a thumb screw has a radial cylinder 34 with a tumbler mechanism. A key (not shown) is inserted into cylinder 34 in order to lock and unlock the device.

Figure 6:
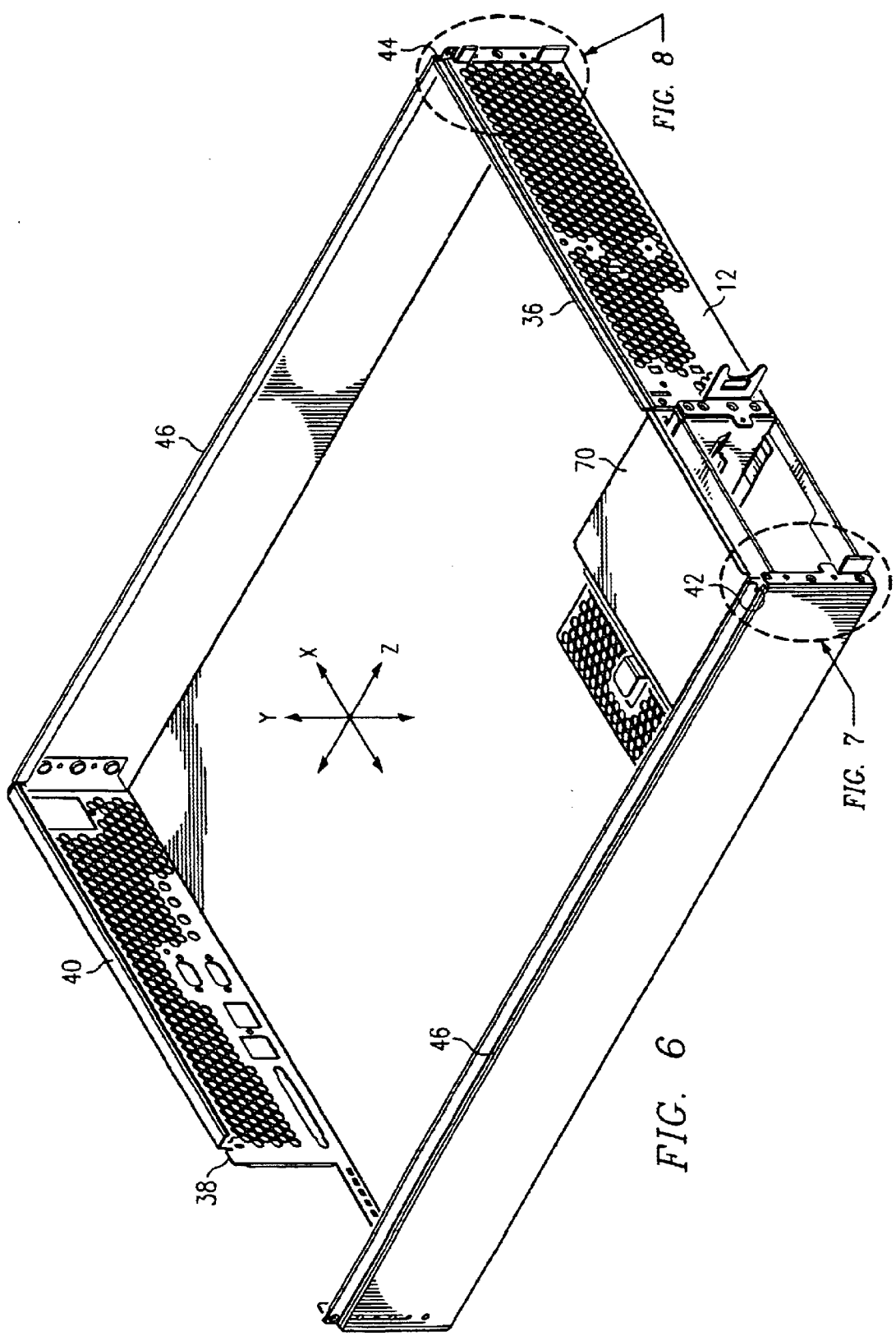
FIG. 6 is a top/front oblique view of the chassis of the computer enclosure of FIG. 1.
Figure 7:
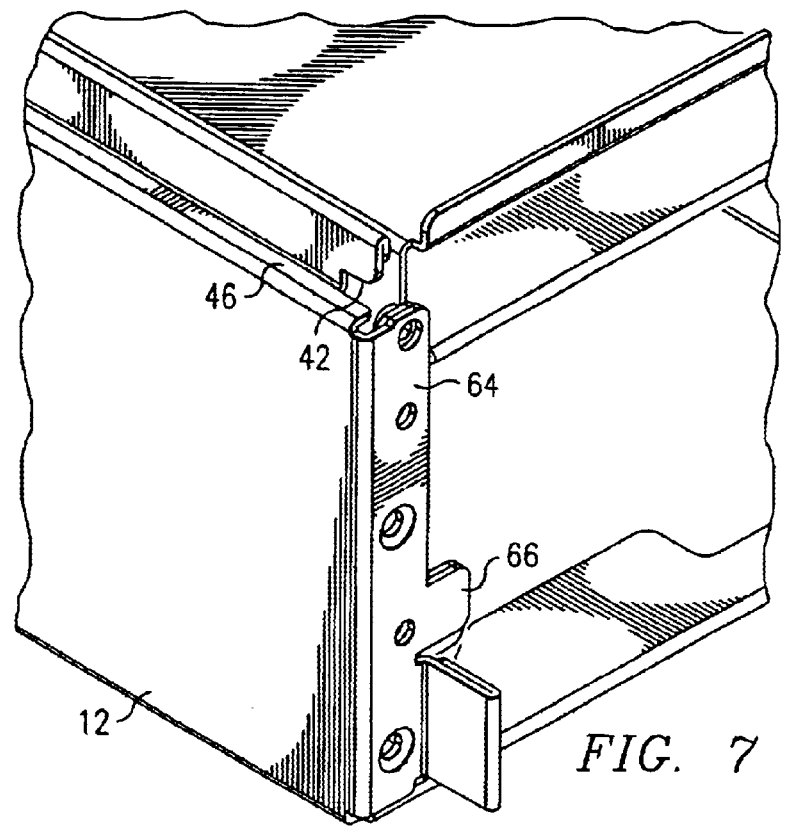
FIGS. 7 and 8 are close-up views of the areas indicated in FIG. 6.
Figure 8:
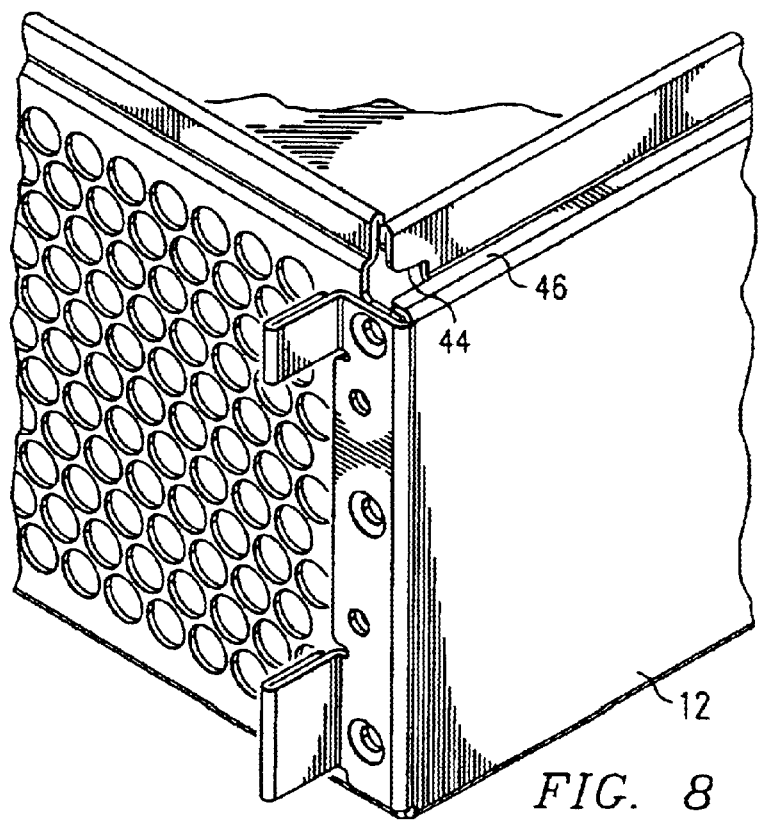

FIGS. 6, 7 and 8 illustrate the portions of chassis 12 that serve to retain access panel 16. Chassis 12 has a front end 36 and a back end 38. Both ends include retaining surfaces. The retaining surface on back end 38 takes the form of a lip 40 extending across a portion of the back end of the chassis and facing the positive z direction. The retaining surfaces on front end 36 take the form of notches 42, 44, which notches also face the positive z direction. In the embodiment shown, shoulders 46 are provided along the length of chassis 12 on the left and right sides. Shoulders 46 prevent panel 16 from moving in the positive and negative x directions as well as in the negative y direction.

FIGS. 9, 10 and 11 illustrate the portions of access panel 16 that engage with retaining surfaces of chassis 12. Access panel 16 has a front end 48 and a back end 50. Both ends include protrusions. The protrusions on front end 48 take the form of tabs 52 on the left and right corners of front end 48. The protrusions on back end 50 take the form of a channel made with a lip 54 that extend across the back edge 50 of panel 16. Locking tab 22 is formed on the front edge 48 of panel 16. To mount panel 16 onto chassis 12, panel 16 may be seated onto shoulders 46 and then slid in the negative z direction until tabs 52 engage notches 42, 44 and lip 54 slides under lip 40. After tabs 52 and lip 54 are so engaged, further movement of panel 16 in the negative z direction is restrained. In addition, movement of panel 16 in the x and y directions is also restrained. Thus, from this position, panel 16 may only be moved in the positive z direction.

Figure 12:
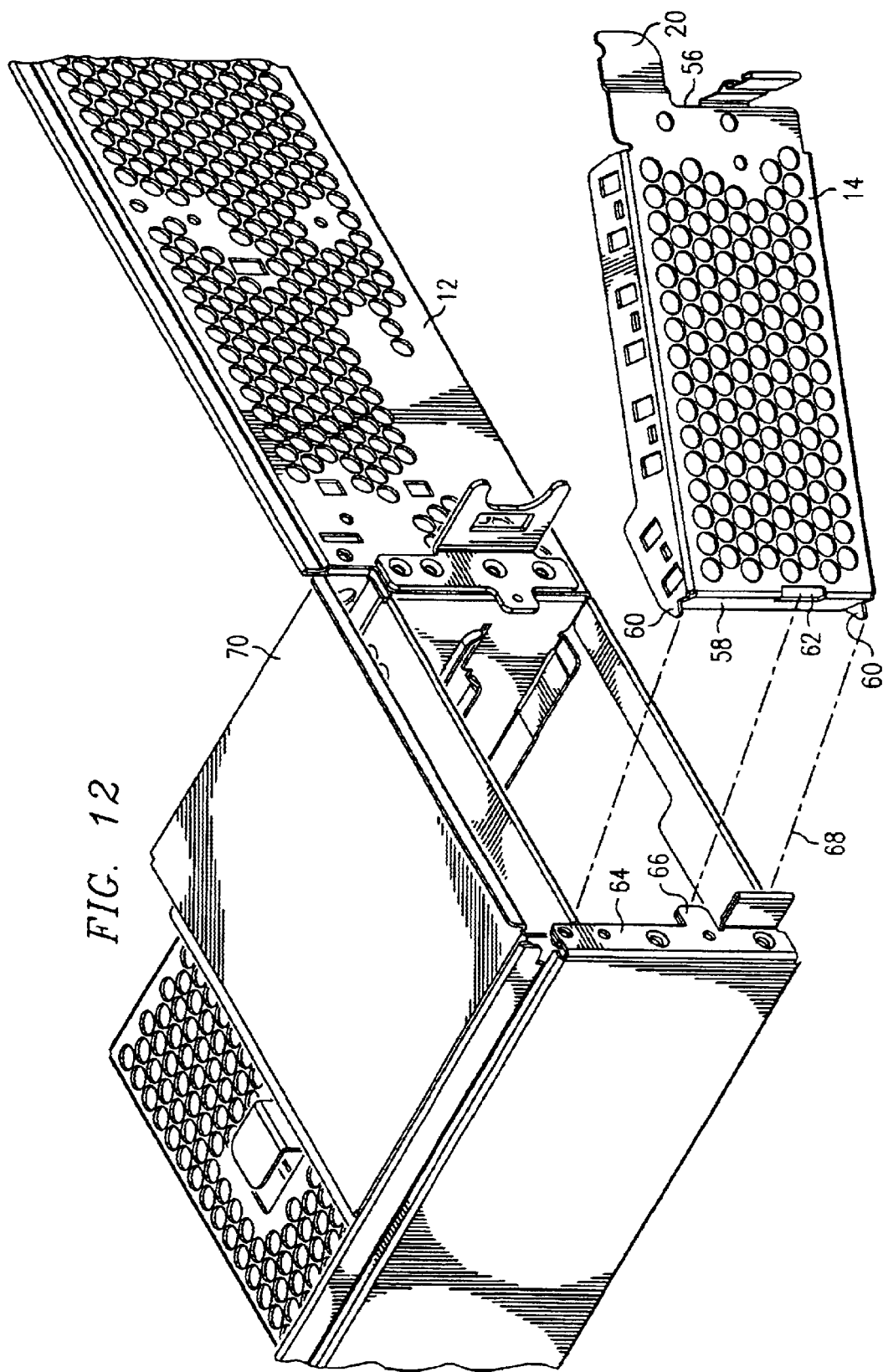
FIG. 12 is an oblique view of the first access panel of FIG. 1 and the portions of the chassis with which it engages.

FIG. 12 illustrates the portions of access panel 14 that engage with retaining surfaces of chassis 12. Access panel 14 has a first end 56 and a second end 58. Locking tab 20 is disposed at first end 56. Second end 58 includes protrusions 60 and a clearance hole 62. The corresponding retaining surface on chassis 12 takes the form of a flange 64 having an interior side that faces the inside of enclosure 10. Flange 64 also includes a protrusion 66. To mount access panel 14 onto chassis 12, panel 14 may be inserted into chassis 12 as indicated by dashed lines 68 so that protrusions 60 engage the interior side of flange 64 and so that protrusion 66 fits through clearance hole 62. Once this has been done, panel 14 may be hinged shut so that locking tab 20 rests against the surface of chassis 12 adjacent to lock hole 24. In this position, chassis 12 restrains panel 14 from moving in the x and y directions, and also in the negative z direction. Panel 14 is, however, free to swing out in the positive z direction at its first end 56.

FIG. 13 illustrates how enclosure 10 looks with both of panels 14, 16 mounted thereon but with locking device 18 removed. As can be seen in the drawing, locking tabs 20, 22 are both located adjacent to lock hole 24 so that the head 30 of locking device 18 can secure tabs 20, 22 against the surface of chassis 12. Tabs 20, 22 do not overlap one another, however. Therefore, when locking device 18 is removed, panels 14, 16 can be opened or removed independently of one another. This feature is in contrast to enclosures of the prior art wherein panels overlap so that they cannot be opened independently of one another.

While the invention has been described herein with reference to a particular embodiment, the illustrated embodiment has been shown by way of example and not by way of limitation. Persons having ordinary skill in the art and having reference to this specification will appreciate that various alternative embodiments may be created while remaining within the scope of the following claims and their equivalents. For example, locking device 18 need not take the form of a locking thumb screw in every embodiment. Instead, other suitable means such as padlocks or cable locks may be used to lockably secure panels 14, 16 to chassis 12. In addition, the invention may find application in tower type computer enclosures and desk top type enclosures as well as in rack mount type enclosures such as the one shown. (For the sake of definition, desk top type will mean enclosures that are wider than they are tall, while tower type will mean enclosures that are taller than they are wide. Rack mount will mean any type of enclosure suitable for mounting in a rack or cabinet with other computers or equipment.) Note that panel 14 was shown herein on the front end of enclosure 10. It could also be located on the back end of the enclosure. Indeed, either or both of the two access panels may be located on any side of enclosure 10 (top, bottom, left, right, front or back) using the inventive technique described and claimed herein. Although panel 14 was shown herein as a door to a disk cage 70, panel 14 need not be a disk cage door in every embodiment. And panel 16 need not be a top panel in every embodiment. Instead, either or both of panels 14 and 16 may, for example, take the form of sides, tops, bottoms, ends or doors.

What is claimed is:

1. A computer enclosures comprising:
   a chassis;
   a first removable access panel having a first locking tab;
   a second removable access panel having a second locking tab; and
   a locking device for securing the first and second locking tabs to the
   chasis such that the first and second locking tabs do not overlap one another; wherein:
       when the first and second removable access panels are mounted to the chassis, the chasis restrains the first and second removable access panels from movement in first and second orthogonal direction; and
       when the locking device is in place, the looking device restrains the first and second removable access panels from movement in a third orthogonal direction by securing the first and second locking tabs to the chassis;
       wherein the looking device is a locking thumb screw.

2. The computer enclosure of claim 1, wherein:
   the chassis comprises a retaining surface having an interior side that faces the inside of the enclosure;
   the first removable access panel comprises first and second ends;
   the first locking tab is disposed on the first end; and
   the second end comprises at least one protrusion operable to engage the interior side of the retaining surface so that the second end cannot be pulled toward the outside of the enclosure when the protrusion is so engaged.

3. The computer enclosure of claim 1, wherein:
   the chassis comprises first and second chassis ends, each of the first and second chassis ends comprising a retaining surface;
   the second removable access panel comprises first and second panel ends, each of the first and second panel ends comprising at least one protrusion; and
   the protrusions are operable to engage the retaining surfaces so that the second removable access panel can be moved only in one direction when the protrusions and retaining surfaces are so engaged.

4. The computer enclosure of claim 1, wherein:
   the locking device comprises a stem and a head;
   the chassis comprises a locking hole for receiving the stem; and
   the first and second locking tabs are secured against the chassis by the head.

5. The computer enclosure of claim 1, wherein:
   the first and second removable access panels are disposed orthogonal to one another.

6. The computer enclosure of claim 1, wherein:
   one of the first and second removable access panels is a disk cage door.

7. The computer enclosure of claim 1, wherein:
   one of the first and second removable access panels is disposed on the front of the enclosure.

8. The computer enclosure of claim 1, wherein:
   one of the first and second removable access panels is disposed on the back of the enclosure.

9. The computer enclosure of claim 1, wherein:
   the enclosure is of the desk top type.

10. The computer enclosure of claim 1, wherein:
    the enclosure is of the tower type.

* * * * *